United States Patent [19]

Takahashi

[11] Patent Number: 5,796,290

[45] Date of Patent: Aug. 18, 1998

[54] TEMPERATURE DETECTION METHOD AND CIRCUIT USING MOSFET

[75] Inventor: Mitsuasa Takahashi, Tokyo, Japan

[73] Assignee: NEC Corporation, Tokyo, Japan

[21] Appl. No.: 736,504

[22] Filed: Oct. 24, 1996

[30] Foreign Application Priority Data

Oct. 26, 1995 [JP] Japan ................. 7-278754

[51] Int. Cl.⁶ ................................. H03K 5/22
[52] U.S. Cl. ........................... 327/512; 307/651
[58] Field of Search ................ 327/63, 72, 512; 307/650, 651; 73/204.19

[56] References Cited

U.S. PATENT DOCUMENTS

| | | | |
|---|---|---|---|
| 3,809,929 | 5/1974 | Vittoz | 307/310 |
| 4,937,646 | 6/1990 | Tihanyi | 357/43 |
| 5,319,268 | 6/1994 | Lyon et al. | 307/529 |
| 5,336,943 | 8/1994 | Kelly et al. | 307/310 |
| 5,355,123 | 10/1994 | Nishiura | 340/653 |
| 5,357,149 | 10/1994 | Kimura | 307/310 |
| 5,629,542 | 5/1997 | Sakamoto et al. | 257/328 |

FOREIGN PATENT DOCUMENTS

| | | |
|---|---|---|
| 4-212470 | 8/1992 | Japan. |
| 5-129598 | 5/1993 | Japan. |
| 5187926 | 7/1993 | Japan. |

Primary Examiner—Timothy P. Callahan
Assistant Examiner—An T. Luu
Attorney, Agent, or Firm—Sughrue, Mion, Zinn, Macpeak & Seas, PLLC

[57] ABSTRACT

A temperature detection circuit using a threshold voltage of a MOSFET with a further improved detection characteristic. The circuit has first and second lateral MOSFETs formed in a well region of a conductivity type which is formed on a surface of a semiconductor region of an opposite conductivity type, a first power source which drives the first lateral MOSFET at an operation point where a temperature has influence on a characteristic between a gate-source voltage and a drain current characteristic thereof, a second power source which drives the second lateral MOSFET at an operation point where the temperature has no influence on a characteristic between a gate-source voltage and a drain current characteristic thereof, and a comparator which compares a difference between outputs from the first and second lateral MOSFETs with a predetermined set value to detect the temperature.

11 Claims, 6 Drawing Sheets

TEMPERATURE DETECTION METHOD AND CIRCUIT USING MOSFET

BACKGROUND OF THE INVENTION

1. Field of the Invention

The present invention relates to a temperature detection method and a temperature detection circuit, more particularly to a temperature detection method using a MOSFET (Metal-Oxide-Semiconductor Field Effect Transistor) and a temperature detection circuit using it.

2. Description of the Prior Art

In semiconductor devices using a high power, to prevent an overheat of semiconductor elements such as a power bipolar transistor and a power MOSFET, a temperature detection circuit is arranged therein, and controls to change the power bipolar transistor or the power MOSFET to a cut-off state in response to a detection output from the temperature detection circuit.

For example, in Japanese Patent Application Laid-open No. Hei 5-129598 (JP, A, 5-129598), as shown in FIG. 1, a temperature detection circuit is disclosed, which uses a temperature detection diode and detects a temperature utilizing a temperature dependency of a reverse leak current in a PN junction of the diode. A temperature detection diode 201 is arranged in the same semiconductor substrate where a semiconductor element which is a temperature detection objective is formed. The anode of the diode 201 is grounded, and the source and the gate of a depletion type MOSFET 202 are connected to the cathode of the diode 201. A power source voltage $V_{DD}$ is supplied to the drain of the MOSFET 202. A buffer 203 which receives a cathode voltage $V_C$ of the diode 201 and has a threshold value of $V_{th}$ is arranged. The output from the buffer 203 is an output of the temperature detection circuit. An operation principle of the temperature detection circuit will be described with reference to FIG. 2.

The voltage characteristic of the reverse leak current of the diode 201 possesses a temperature dependency. The diode 201 has current-voltage (I-V) characteristics as shown with the solid lines 211 to 214 at the temperatures $T_1$ to $T_4$ ($T_1<T_2<T_3<T_4$), respectively. On the other hand, the drain current of the depletion type MOSFET 202 changes showing the I-V characteristic as shown by the dotted line 215, which is in accordance with the cathode voltage $V_C$ of the diode 201. Since the reverse leak current of the diode 201 and the drain current of the MOSFET agree, a cross point of the I-V characteristic curves of the diode 201 and the MOSFET 202 shows the operation point of both the diode 210 and the MOSFET 202. The solid lines 211 to 214 showing the characteristic of the diode 201 at every temperature T1 to T4 cross the dotted line 215 showing the characteristic of the MOSFET 202. When the temperature is $T_1$, the cathode voltage $V_C$ is $V_1$, and when the temperature is $T_4$, the voltage $V_C$ is $V_4$. Since the cathode voltage $V_C$ is an input voltage to the buffer 203, by setting the threshold value $V_{th}$ of the buffer 203 at the value of the cathode voltage $V_C$ corresponding to the temperature to be detected, the output from the buffer 203 is inverted at the threshold value $V_{th}$. The temperature to be detected is detected so that the overheat of the semiconductor element can be detected.

However, since the temperature detecting circuit shown in FIG. 1 utilizes the temperature dependency of the reverse leak current of the diode 201, the temperature detecting circuit is apt to be affected by crystal defects in the semiconductor substrate, and a temperature detection value of the detecting circuit varies due to the variation of the reverse leak current caused by the crystal defects. Furthermore, besides the characteristic of the diodes 201, a plurality of characteristic values of the devices such as the characteristic value of the depletion type MOSFET 202 and the threshold voltage $V_{th}$ of the buffer 203 contribute to the detection characteristic. Therefore, setting of the detection temperature is difficult.

As a temperature detection method, beside the method utilizing the temperature dependency of the reverse leak current at the PN junction of the diode, there is a method utilizing a temperature dependency of a threshold value of a MOSFET. The Japanese Patent Application Laid-open No. Hei 4-212470 (JP, A, 4-212470), as shown in FIG. 3, discloses a circuit wherein a longitudinal type MOSFET 321 for a high-current and a lateral type MOSFET for temperature detection (a temperature detection cell 322) are arranged adjacent to each other in the same semiconductor substrate so that a field effect transistor 351 including a temperature detection section is constituted, and the temperature of the longitudinal MOSFET 321 is detected using the temperature detection cell 322.

An N⁻ epitaxial layer 302 is formed on one surface of an N⁺ substrate 301, and a drain electrode 314 of the longitudinal MOSFET 321 is formed on the other surface. A P⁻ well region 303 and a P base region 306 are formed on the surface of the N⁻ epitaxial layer 302. The P⁻ well region 303 is a region where the temperature detection cell 322 of the lateral MOSFET is to be formed, and on the surface of the well region 303, an N⁺ drain region 315 and an N⁺ source region 316 are formed. A gate electrode 305 is arranged on a region (a channel region) between the N⁺ drain region 315 and the N⁺ source region 316 interposing a gate oxide film 304. Further, an interlayer insulating film 309 is formed so as to cover the entire surface of the semiconductor substrate including the gate electrode 305. The N⁺ drain region 315 is connected to a drain electrode 311 on the interlayer insulating film 309 through a contact hole. The N⁺ source region 316 is connected to a source electrode 310 on the interlayer insulating film 309 through a contact hole.

On the other hand, the P base region 306 has a well type structure, which includes an N⁺ source regions 307 serving as a source of the longitudinal MOSFET 321. The source of the longitudinal MOSFET 321 and the source of the temperature detection cell 322 are connected in common, and corresponding to this, the foregoing source electrode 310 is connected to the P base region 306 and the N⁺ source region 307 through the contact hole formed in the interlayer insulating film 309. The gate electrode 309 of the longitudinal MOSFET 321 is formed on the surface of the P base region 306 interposing the gate oxide film 304. One portion of the gate electrode 309 extends to a region above the N⁻ epitaxial layer 302 and the N⁺ source region 307.

A typical example of the circuit using the field effect transistor 351 including the temperature detection section is shown in FIG. 4. In the typical example of FIG. 4, a longitudinal MOSFET 321 incorporated in the field effect transistor 351 is used as a source grounded circuit. The source of the longitudinal MOSFET 321 and the source of the temperature detection cell 322 are connected to each other and they are grounded as a common source S. A gate driving circuit 352 is connected to the gate $G_1$ of the longitudinal type MOSFET 321 and a power source voltage $V_{DD}$ is supplied to the drain $D_1$ thereof. The drain $D_2$ of the temperature detection cell 322 is connected to the gate $G_2$ thereof as well as one input terminal of a comparator 353, and the drain $D_2$ is connected also to a constant current source 354. Therefore, the temperature detection cell 322 is driven with a constant current supply. A reference voltage $V_{ref}$ is input to the other input terminal of the comparator 353. The output from the comparator 353 is input to the gate driving circuit 352. The circuit shown in FIG. 4 is designed such that an action such as the turning-off of the MOSFET 321 is taken when the over-heating state might be detected. After all, in this circuit, the temperature detection cell 322 is driven with a constant current, and a gate-source voltage $V_{GS}$ which varies with the temperature is fetched. The voltage $V_{GS}$ is compared with the reference voltage $V_{ref}$ whereby the protection of an output transistor, that is, the longitudinal type MOSFET 321, against the overheat is performed.

However, in the overheat prevention circuit shown in FIG. 4, room for devising a way to generate the reference voltage $V_{ref}$ to the comparator 353 is left. Specifically, a method for the generation of the reference voltage $V_{ref}$ to the comparator 353 to detect the temperature with high precision, which is not subjected to the influence of the variation of the threshold value of each of the MOSFETs, has been desired.

SUMMARY OF THE INVENTION

An object of the present invention is to provide a temperature detection method using a threshold voltage of a MOSFET with a further improved detection characteristic by providing a preferable generation method of a reference voltage $V_{ref}$.

Another object of the present invention is to provide a temperature detection circuit for detecting a temperature using a threshold value of a MOSFET with a further improved detection characteristic.

Still another object of the present invention is to provide a semiconductor device which is suitable for a temperature detection circuit with an improved detection characteristic.

The foregoing first object is achieved by a temperature detection method wherein a temperature is detected using a temperature dependency of a relation between a gate-source voltage of a first lateral MOSFET and a drain current thereof, the first lateral MOSFET being formed in a well region of a conductive type formed in a surface of a semiconductor region of an opposite conductivity type to the conductive type of the well region, wherein an operation point of a second lateral MOSFET formed in the well region is set at the region where a temperature dependency of a relation between a gate-source voltage of the second lateral MOSFET and a drain current thereof is very small, and a temperature detection is carried out using as a reference at least one of the gate-source voltage of the second lateral MOSFET and the drain current thereof.

The foregoing second object is achieved by a temperature detection circuit which comprises first and second lateral MOSFETs formed in a well region of a conductivity type on a surface of a semiconductor region of an opposite conductivity type to the conductivity type of the well region, a first power source for driving the first lateral MOSFET at an operation point where a temperature has an effect on a characteristic between a gate-source voltage and a drain current thereof, a second power source for driving the second lateral MOSFET at an operation point where the temperature has no influence on the characteristic between the gate-source voltage and the drain current thereof, and a comparator for detecting the temperature by comparing a predetermined set value with a difference between outputs from the first and second MOSFETs.

The foregoing still other object of the present invention is achieved by a semiconductor device wherein a first lateral MOSFET is driven at an operation point where a temperature has an influence on a characteristic between a gate-source voltage and a drain current thereof, a second lateral MOSFET is driven at an operation point where the temperature has no influence on the characteristic between the gate-source voltage and the drain current thereof, the first and second lateral MOSFETs being formed in a well region of a conductivity type on a semiconductor region of an opposite conductivity type to the conductivity type of the well region, and the temperature is determined a difference outputs from the first and second lateral MOSFETs.

In the present invention, the lateral type MOSFET having a similar structure to the temperature detection cell is formed in the same well region where the temperature detection cell is formed. An operation point of the lateral MOSFET is set at a region where a temperature dependency is not found, and the lateral MOSFET is used as a reference voltage cell. A reference voltage is obtained from the reference voltage cell so that variations of a threshold voltage are canceled. Thus, a temperature detection is possible with higher precision.

The above and other objects, features and advantages of the present invention will become apparent from the following description based on the accompanying drawings which illustrate an example of a preferred embodiment of the present invention.

DESCRIPTION OF THE PREFERRED EMBODIMENT

Figure 1:
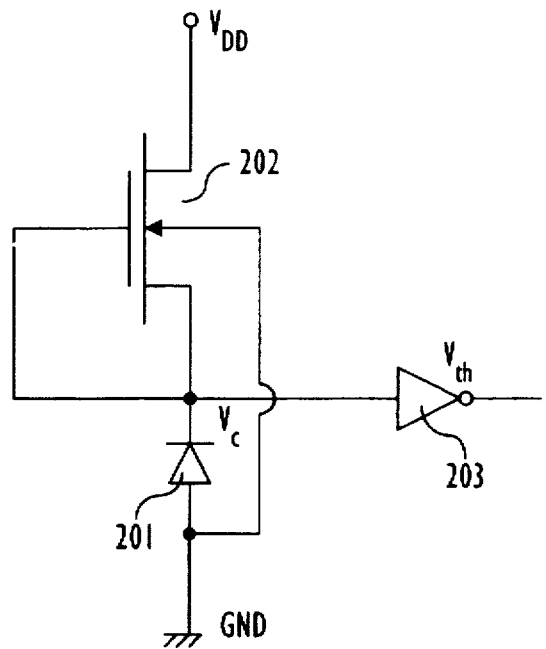
FIG. 1 is a circuit diagram showing an example of a constitution of a conventional temperature detection circuit which utilizes a reverse leak current of a diode.
Figure 2:
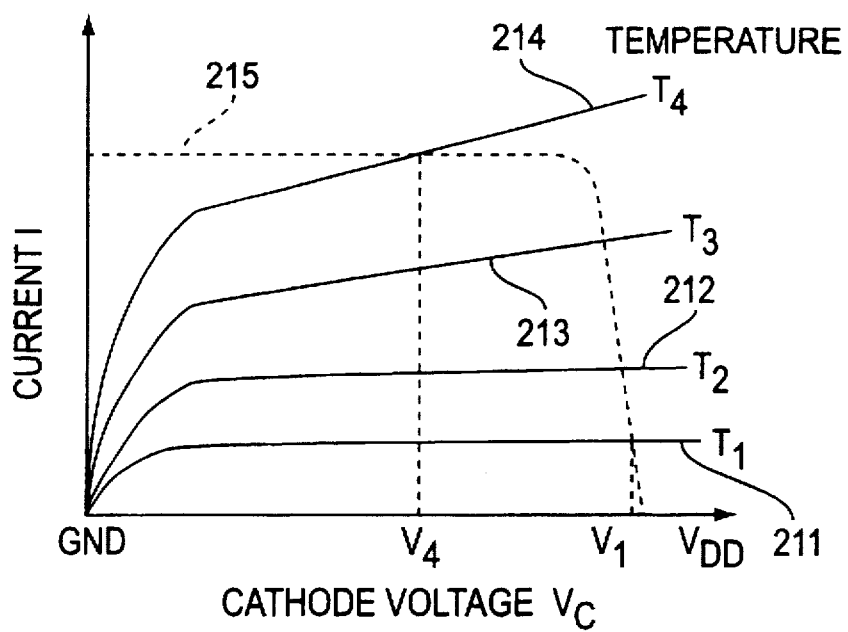
FIG. 2 is a current-voltage characteristic diagram for explaining an operation principle of the temperature detection circuit shown in FIG. 1.
Figure 3:
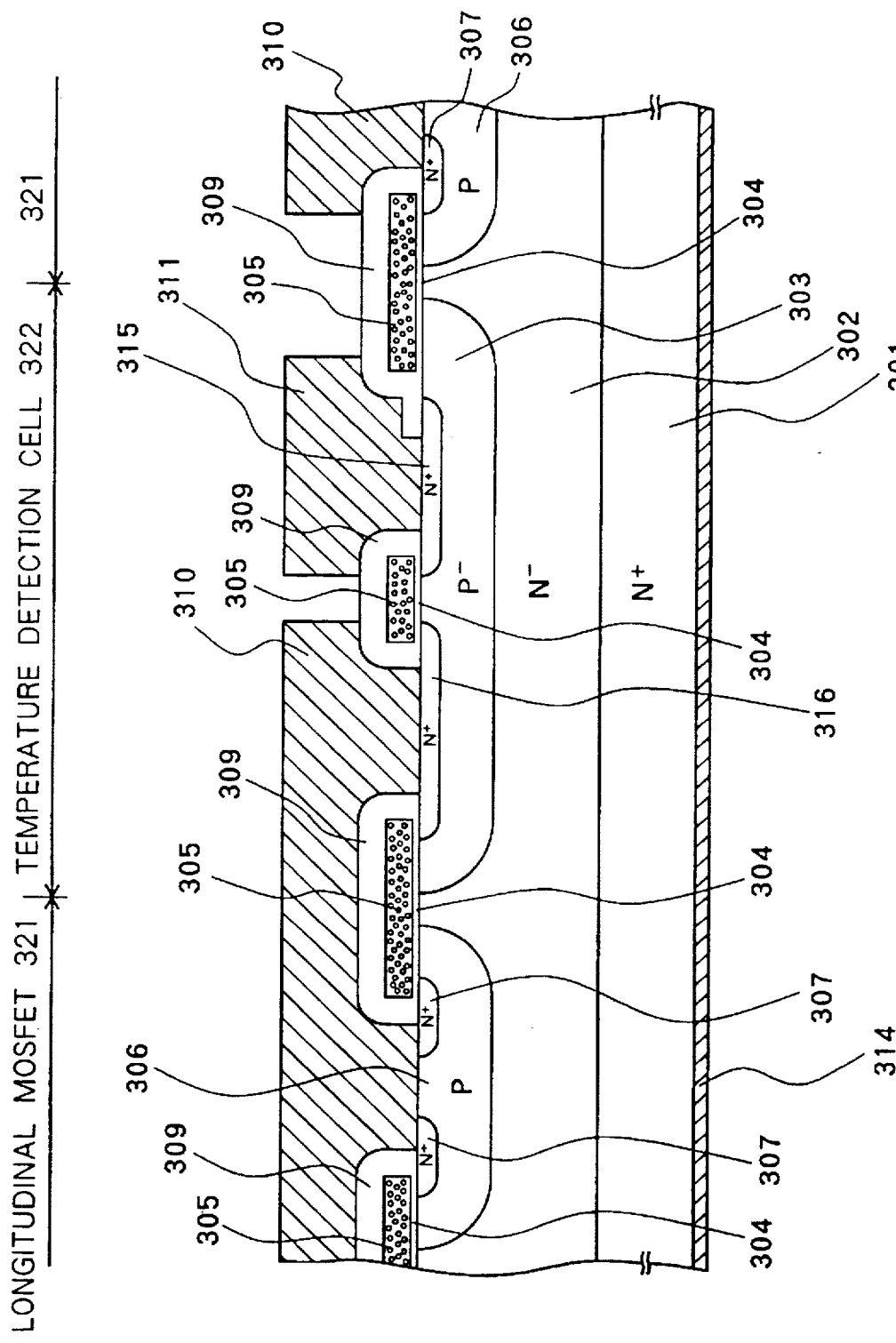
FIG. 3 is a section view showing a conventional field effect transistor incorporating a temperature detection section.
Figure 4:
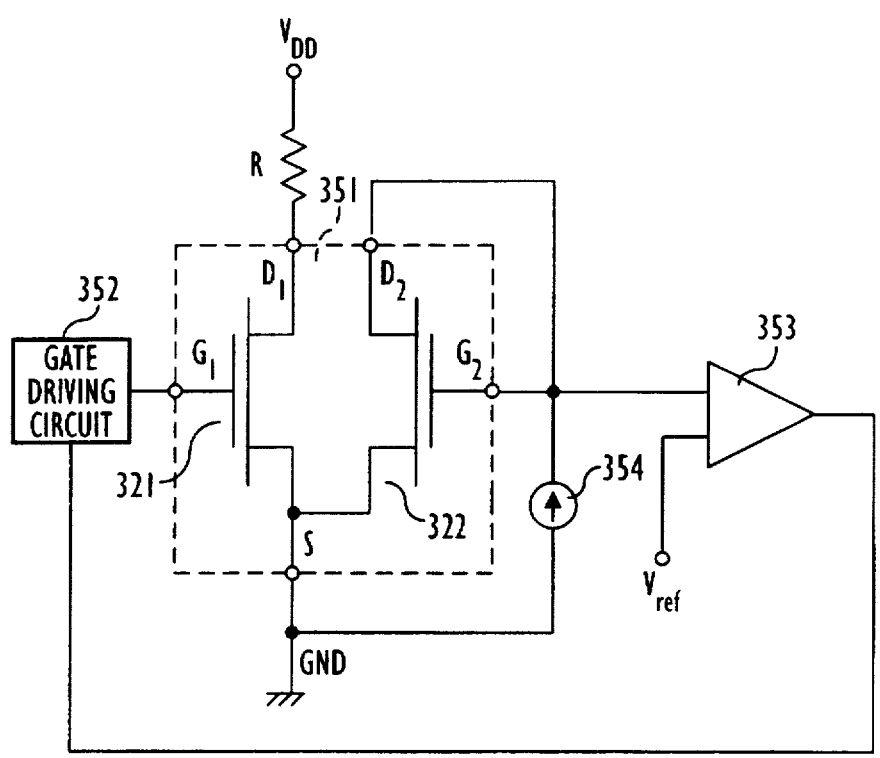
FIG. 4 is a circuit diagram showing a constitution of an overheat prevention circuit which uses the field effect transistor incorporating the temperature detection section shown in FIG. 3.
Figure 5:
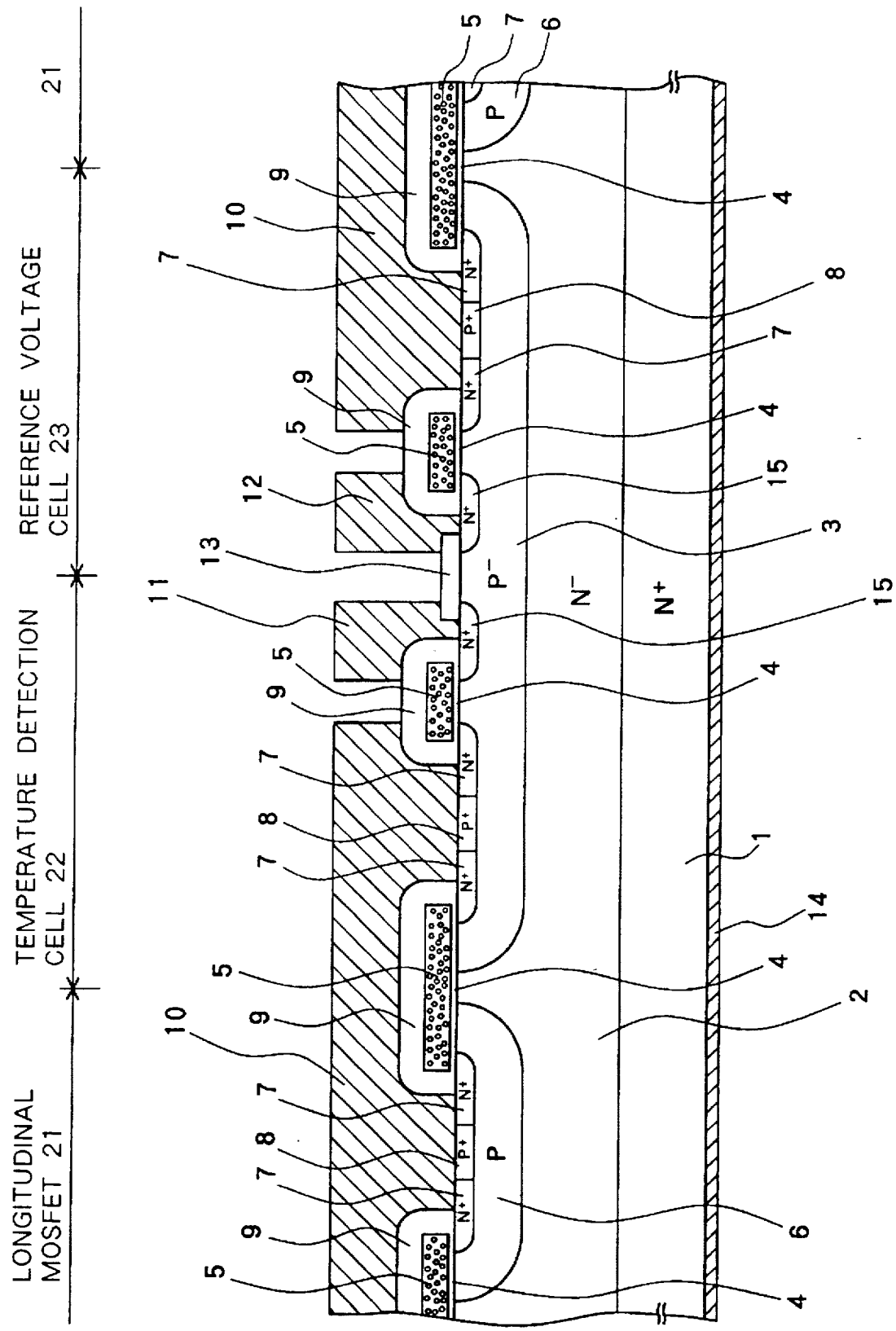
FIG. 5 is a section view showing a field effect transistor incorporating a temperature detection section of a preferable embodiment of the present invention.

A field effect transistor 101 incorporating a temperature detection section of a preferred embodiment of the present invention shown in FIG. 5 is used for embodying a temperature detection method of the present invention. In this embodiment, an example for performing a detection of overheat of an N channel longitudinal type MOSFET 21, the withstand voltage of which is 60 V, will be described.

A silicon semiconductor substrate, in which an N⁻ epitaxial layer 2 is formed on one surface of an N⁺ type silicon substrate 1, is constituted. On the other surface of the substrate 1, a drain electrode 14 of the longitudinal MOSFET 21 is arranged. A P⁻ type well region 3 and a P type base region 6 are formed on a surface of the N⁻ type epitaxial layer 2. The P⁻ type well region 3 is the one where two lateral type MOSFETs are to be formed, which are a temperature detection cell 22 and a reference voltage cell 23. On a surface of the P⁻ well region 3, an N⁺ drain region 15 and an N⁺ source region 7 are formed. The temperature detection cell 22 and the reference voltage cell 23 are separated from each other by a field oxide film 13. Each region lying between the N⁺ drain region 15 and the N⁺ source region 7 is a channel region, and a gate electrode 5 is formed interposing the gate oxide film 4 on each channel region. An interlayer insulating film 9 is formed covering these regions including the gate electrodes 5. The N⁺ drain regions 15 which respectively correspond to the temperature detection cell 22 and the reference voltage cell 23 are connected to the drain electrodes 11 and 12 on the interlayer insulating film 9 through the contact holes. The N⁺ source regions 7, each of which corresponds to the temperature detection cell 22 and the reference voltage cell 23, are connected-in common to the source electrode 10 on the interlayer insulating film 9 through the contact holes.

The P base region 6 has a well type structure, which includes an N⁺ source region 7 and a P⁺ source region 8 serving as a source of the longitudinal type MOSFET 21. The source of the longitudinal MOSFET 21 is also connected to the common source of the temperature detection cell 22 and the reference voltage cell 23. The foregoing source electrode 10 is connected to the N⁺ source region 7 and the P⁺ source region 8 in the P base region 6 through the contact holes formed in the interlayer insulating film 9. A gate electrode 5 of the longitudinal MOSFET 21 is formed on the surface of the P base region 6 by interposing the gate oxide film 4, and one portion of the gate electrode 5 extends above the N⁻ epitaxial layer 2 and the N⁺ source region 7, and further it extends above the N⁺ source 7 in the P⁻ well region 3. In the P⁻ well region 3, a P⁺ source region 8 is formed between both N⁺ source regions 7. The gate electrode 5 of the longitudinal MOSFET 21 extends to one of the N⁺ source regions 7, and the other N⁺ source region 7 corresponds to the extents of the gate electrodes 5 of the temperature detection cell 22 and the reference voltage cell 23. The P⁺ source region 8 is also connected to the source electrode 10.

Figure 9:
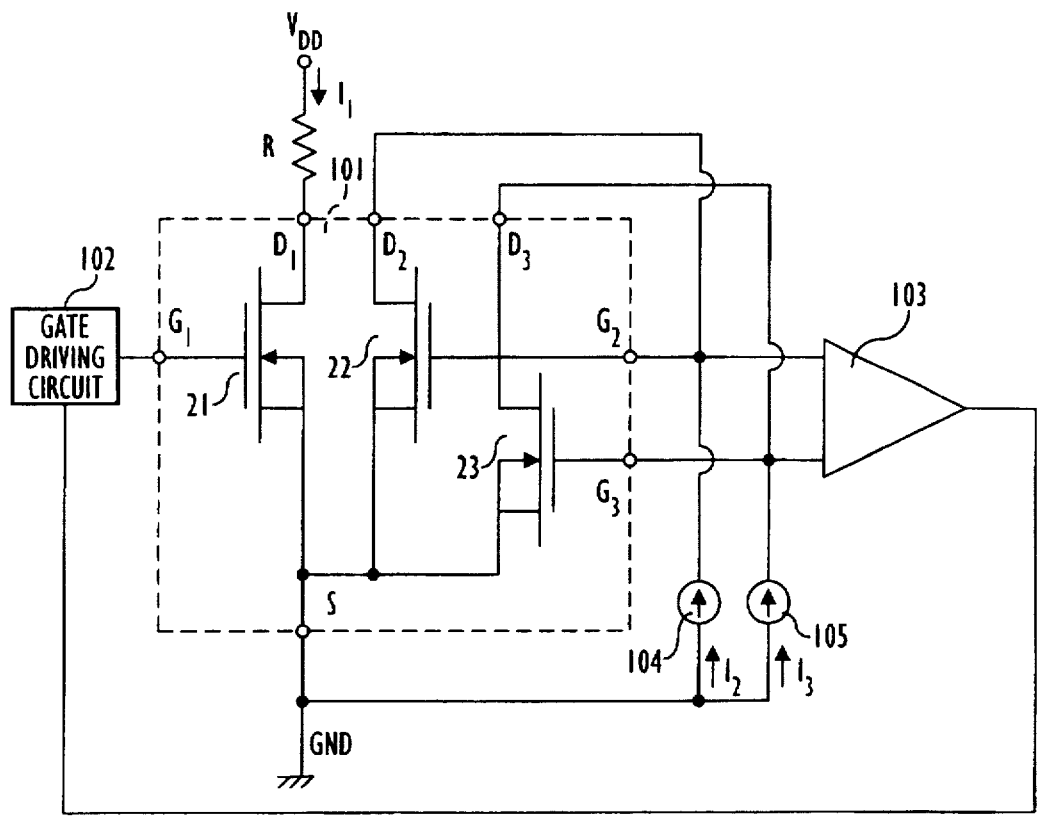
FIG. 9 is a circuit diagram showing a constitution of an overheat protection circuit using the field effect transistor incorporating the temperature detection section shown in FIG. 5.

By constituting the field effect transistor 101 incorporating the temperature detection section as described above, the N channel longitudinal MOSFET 21, the N channel lateral MOSFET (temperature detection cell 22) and the N channel lateral MOSFET (reference voltage cell 23) are arranged in the same silicon semiconductor substrate adjacent to each other, and the sources of them are connected in common (see FIG. 9).

Next, manufacturing steps of the field effect transistor 101 incorporating the temperature detection section will be described. The N⁻ epitaxial layer 2 of 7 μm thick, in which phosphorus (P) is doped to make its resistivity 0.85 Ω·cm, is grown on the silicon substrate 1 in which arsenic (As) is doped to make its resistivity about $6 \times 10^{-3}$ Ω·cm in maximum. Then, on the surface of the N⁻ epitaxial layer 2, the P⁻ well region 3 having a thickness of about 2 μm, which is doped so as to be the P type of a surface concentration of about $3 \times 10^{16}$ cm⁻³, is formed, and the field oxide film 13 having a thickness of about 1 μm is formed. Thereafter, the gate oxide film 4 having a film thickness of about 50 nm is formed.

Next, a polysilicon layer having a film thickness of about 60 nm, which is doped with phosphorus such that a sheet resistivity thereof is about 13 Ω, is deposited. Then, it is patterned so that the gate electrode 5 is formed. The P base region 6 is formed self-aligned with the gate electrode 5, on the surface of the N⁻ epitaxial layer 2 other than the P⁻ well region 3. Subsequently, in the P base region 6, the N⁺ source region 7 is formed self-aligned with the gate electrode 5, and the P⁺ source region 8 is formed selectively in a portion of the N⁺ source region 7. Thereafter, a BPSG (boro-phospho-silicate glass) film of about 650 nm thick is formed as the interlayer insulating film 9. The contact holes are formed in the interlayer insulating film 9. Thereafter, an aluminum (Al) film of about 5μm thick is formed by sputtering and it is patterned so that the source electrode 10 and the drain electrodes 11 and 12 are formed. Furthermore, the drain electrode 14 is deposited by evaporation on the back side of the N⁺ substrate 1. Thus, the field effect transistor 101 incorporating the temperature detection section is completed.

Figure 6:
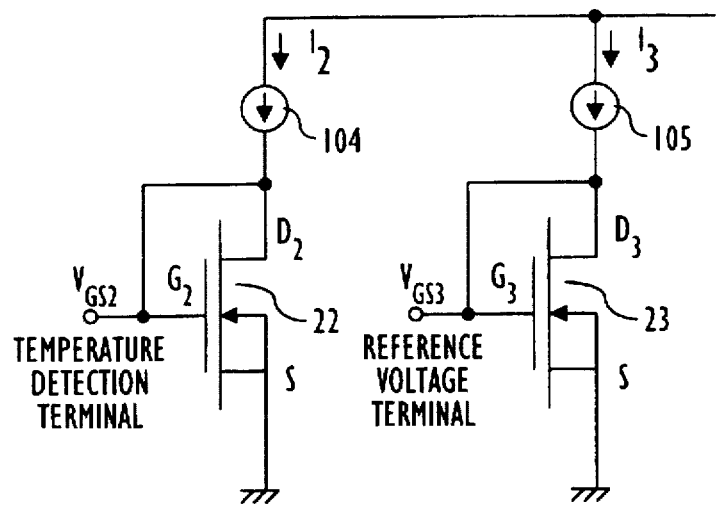
FIG. 6 is a circuit diagram for explaining a temperature detection principle of the field effect transistor incorporating the temperature detection section shown in FIG. 5.

Next, a principle of a temperature detection in the field effect transistor incorporating the temperature detection section will be described. In this description, operations of the temperature detection cell and the reference voltage cell will be explained using FIG. 6.

In the temperature detection cell 22, the source S is grounded, the gate $G_2$ and the drain $D_2$ are short-circuited. Further, the drain $D_2$ is connected to a constant current source 104, and the cell 22 operates with the current $I_2$. Similarly, in the reference voltage cell 23, the source S is grounded, and the gate $G_3$ and the drain $D_3$ are short-circuited. The drain $D_3$ is connected to a constant current source 105 and the cell 23 operates with the current $I_3$.

Figure 7:
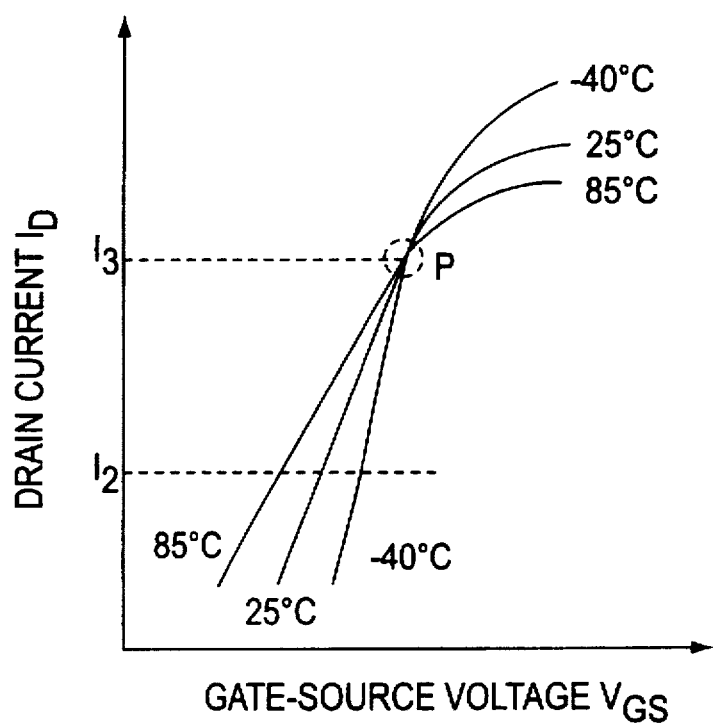
FIG. 7 is a current-voltage characteristic diagram for explaining driving currents flowing through a temperature detection cell and a reference voltage cell.

Assuming that the temperature detection cell 22 and the reference voltage cell 23 have the same dimensions, each of the cells 22 and 23 shows the gate-source voltage $V_{GS}$ vs. drain current $I_D$ characteristic for every temperature as shown in FIG. 7. In FIG. 7, the characteristic curves corresponding to each of the temperatures cross near the region P. In this region, if the drain current $I_D$ is determined, the gate-source voltage $V_{GS}$ is decided regardless of the temperature. It has been known that in the $V_{GS}$-$I_D$ characteristic of MOSFETs, generally, there is a current level regardless of a temperature and another current level having a negative temperature characteristic of about −7 mV/° C. When the current level having no temperature dependency is set to be the drain current $I_3$ of the reference voltage cell 23, the current level having the negative temperature characteristic is set to be the drain current $I_2$ of the temperature detection cell 22, and both cells 22 and 23 are driven by being supplied with the constant currents, the gate-source voltage $V_{GS2}$ of the temperature detection cell 22 which appeares in the temperature detection terminal has a temperature characteristic about −7 mV/° C., and the source-gate voltage $V_{GS3}$ of the reference voltage cell 23 which appeares in the reference voltage terminal is constant regardless of the temperature. Therefore, it is possible to detect the temperature of the semiconductor substrate from the difference between the source-gate voltages $V_{GS2}$ and $V_{GS3}$ so that the overheat of the longitudinal MOSFET 21 formed in the semiconductor substrate can be detected.

In addition, by changing the dimensions of the temperature detection cell 22 and the reference voltage cell 23, for example, by making the channel width of the reference voltage cell 23 smaller than that of the temperature detection cell 22, the current density of the temperature detection cell 22 to the reference voltage cell 23 can be set to be $I_2:I_3$ with the constant current sources supplying the same current value. Similarly to the above, the temperature of the semiconductor substrate can be detected. Furthermore, it is also possible to drive the temperature detection cell and the reference voltage cell with a constant voltage, not with a constant current. In this case, a gate voltage of the reference voltage cell is set at a value that the drain current $I_D$ does not show the temperature dependency for the gate-source voltage $V_{GS}$ and the gate voltage of the temperature detection cell is set at a value that the drain current $I_D$ shows the temperature characteristic. The difference between the drain currents in both cells may be detected.

Figure 8:
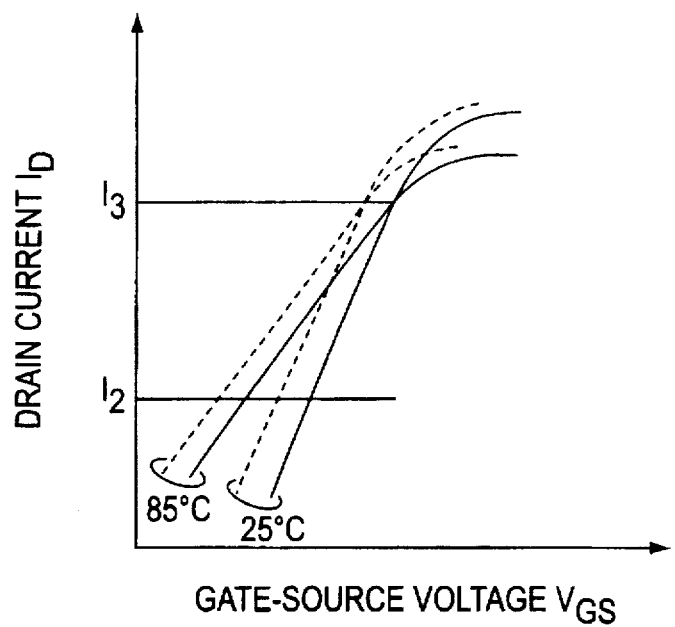
FIG. 8 is a current-voltage characteristic diagram for explaining relative precision.

By the way, it has been said that a threshold value of a MOSFET is generally about 1±0.2 V, and it has been said that absolute precision of the threshold values is about 20% due to variations on manufacturing. However, in this embodiment, since the temperature detection cell 22 and the reference voltage cell 23 having the same structure are formed adjacent to each other through the same manufacturing processes, the threshold values of both cells 22 and 23 can be set at the same value within the relative precision of 3%, so that a detection precision of the temperature can be increased. FIG. 8 is a drawing for explaining how the relative precision is high. In the drawing, as the threshold value becomes higher, the $V_{GS}$-$I_D$ characteristic curve moves in parallel toward the right direction, and as the threshold value becomes lower, it moves in parallel toward the left direction. When the characteristics of the temperature detection cell 22 and the reference voltage cell 23 are as shown with the solid lines shown in FIG. 8, the difference between the threshold values of the temperature detection cells 22 and the reference voltage cells 23 is approximately equal to be about the above-described relative precision, even though the threshold values become lower as shown with the dotted lines. Therefore, the gate-source voltage $V_{GS}$ moves totally toward lower level, and the absolute value $|V_{GS2}-V_{GS3}|$ of the difference of the gate-source voltage $V_{GS2}$ and $V_{GS3}$ of the temperature detection cell 22 and the reference voltage cell 23 is not greatly influenced. After all, though the threshold values vary, the temperature detection precision can be maintained.

An example of the overheat protection circuit which incorporates the foregoing field effect transistor 101 having the temperature detection section is shown in FIG. 9. In FIG. 9, the longitudinal type MOSFET 21 is used as an output transistor. When the generation of heat by the longitudinal MOSFET 21 is detected and the generated heat exceeds the set temperature, the restriction of the operation of the MOSFET 21 is performed so that the generation of the heat is controlled.

The common source S of the longitudinal MOSFET 21, the temperature detection cell 22 and the reference voltage cell 23 is grounded. The drain $D_1$ of the longitudinal MOSFET 21 is connected to the power source VDD through the load resistance R, the gate $G_1$ thereof is connected to the gate driving circuit 102. The gate $G_2$ and the drain $D_2$ of the temperature detection cell 22 are connected, in common, to one input terminal of the comparator 103, and the gate $G_3$ and the drain $D_4$ of the reference voltage cell 23 are connected, in common, to the other input terminal of the comparator 103. Furthermore, the constant current sources 104 and 105 are connected to the drain $D_2$ of the temperature detection cell 22 and the drain $D_3$ of the reference voltage cell 23, respectively, and the temperature detection cell 22 and the reference voltage cell 23 are driven with the foregoing currents $I_2$ and $I_3$. The output from the comparator 103 is input to the gate driving circuit 102.

In this overheat protection circuit, when the generated heat exceeds the set temperature, that is, when the difference between the two input to the comparator 103 exceeds the predetermined set value, the output of the comparator 103 is inverted, whereby the gate driving circuit 102 chops the longitudinal MOSFET 21 or turns it off to control its operation. Thus, the generation of the heat is restricted.

As described above, as to this embodiment of the present invention, the case where the protection of the overheat of the N channel longitudinal type MOSFET having a withstand voltage of 60 V is performed is illustrated as an example. However, the present invention is not limited to the above, when a MOSFET having a lower withstand voltage or a higher withstand voltage than that of this N channel longitudinal MOSFET is used, the same effects can be obtained. In addition, in the case where a P channel MOSFET is employed, or where P and N channel MOSFETs are employed, the same effects can be attained. Furthermore, the present invention is not constituted simply as a single field effect transistor incorporating a temperature detection section but can be applied to an integrated circuit and the like, and the present invention can be available for an overheat protection of a bipolar transistor and a thyristor and the like.

It is to be understood, however, that although the characteristics and advantages of the present invention have been set forth in the foregoing description, the disclosure is illustrative only, and changes may be made in the arrangement of the parts within the scope of the appended claims.

What is claimed is:

1. A temperature detection method in which a temperature is detected using a temperature dependency of a relation between a gate-source voltage of a first lateral MOSFET and a drain current thereof, said first lateral MOSFET being formed in a well region of one conductivity type formed in a surface of a semiconductor region of an opposite conductivity type to said one conductivity type of said well region, characterized in that an operation point is set at a region where a temperature dependency in a relation between a gate-source voltage of a second lateral MOSFET and a drain current thereof is very small, said second lateral MOSFET being formed in said well region; and a temperature of said lateral MOSFETs is detected using as a reference at least one of the gate-source voltage of said second lateral MOSFET and the drain current thereof;

wherein said first and second lateral MOSFETs and a semiconductor element are formed in a same semiconductor region where a temperature is detected; and wherein said at least one of the gate-source voltage of said second lateral MOSFET and the drain current thereof are compared resulting in an output that a driving circuit uses to control the operation of said semiconductor element.

2. A temperature detection method according to claim 1, wherein said semiconductor substrate is a silicon semiconductor substrate.

3. A temperature detection method comprising the steps of:

forming first and second lateral MOSFETs in a well region of one conductivity type formed on a surface of a semiconductor region of an opposite conductivity type to said one conductivity type of said well region;

short circuiting a gate and drain of said first lateral MOSFET and short circuiting a gate and drain of said second lateral MOSFET;

driving said first lateral MOSFET with a constant drain current at a value where a temperature has influence on a gate source voltage thereof;

driving said second lateral MOSFET with a constant drain current at a value where the temperature has no influence on the gate-source voltage thereof; and detecting the temperature according to a difference between the gate-source voltage of said first lateral MOSFET and the gate-source voltage of said second lateral MOSFET;

wherein said first and second lateral MOSFETs and a semiconductor element are formed in a same semiconductor region where a temperature is detected; and wherein said gate-source voltage of said first lateral MOSFET and the gate-source voltage of said second lateral MOSFET are compared resulting in an output that a driving circuit uses to control the operation of said semiconductor element.

4. A temperature detection method according to claim 3, wherein said semiconductor substrate is a silicon semiconductor substrate.

5. A temperature detection circuit, comprising:

first and second lateral MOSFETs formed in a well region of one conductivity type which is formed on a surface of a semiconductor region of an opposite conductivity type to said conductivity type of said well region;

a first power source which drives said first lateral MOSFET at an operation point where a temperature has influence on a characteristic of one of a gate-source voltage and a drain current thereof;

a second power source which drives said second lateral MOSFET at an operation point where the temperature has no influence on a characteristic of one of a gate-source voltage and a drain current thereof;

a comparator which compares a difference between said influenced characteristic of said first MOSFET and said uninfluenced characteristic of said second lateral MOSFET with a predetermined set value to determine if a predetermined temperature has been exceeded; and a driving circuit outputting a signal which controls operation of said semiconductor element in response to an output from said comparator.

6. A temperature detection circuit according to claim 5, wherein said first power source is a first constant current source connected to a drain of said first lateral MOSFET; said second power source is a second constant current source connected to a drain of said second lateral MOSFET; a gate and the drain of said first lateral MOSFET are shortcircuited; a gate and the drain of said second lateral MOSFET are shortcircuited; sources of said first and second lateral MOSFETs are grounded in common; and drain voltages of said first and second lateral MOSFETs are input to said comparator.

7. A temperature detection circuit according to claim 5, wherein said first and second lateral MOSFETs and a semiconductor element are formed in a same semiconductor region where a temperature is detected.

8. A temperature detection circuit according to claim 7, wherein said semiconductor substrate is a silicon semiconductor substrate.

9. A temperature detection circuit according to claim 7, wherein said semiconductor element for the temperature detection is a longitudinal MOSFET having a drain region formed in said semiconductor region.

10. A temperature detection circuit according to claim 6, wherein said first and second lateral MOSFETs and a semiconductor element are formed in a same semiconductor region where a temperature is detected.

11. A temperature detection circuit according to claim 10 wherein said semiconductor element is a longitudinal MOSFET having a drain region formed in said semiconductor region.

* * * * *